United States Patent

Moriuma et al.

Patent Number: 5,275,910
Date of Patent: Jan. 4, 1994

[54] POSITIVE RADIATION-SENSITIVE RESIST COMPOSITION

[75] Inventors: Hiroshi Moriuma, Nara; Hirotoshi Nakanishi, Mishima; Yasunori Uetani, Toyonaka, all of Japan

[73] Assignee: Sumitomo Chemical Company, Limited, Osaka, Japan

[21] Appl. No.: 960,695

[22] Filed: Oct. 14, 1992

[30] Foreign Application Priority Data

Nov. 1, 1991 [JP] Japan .................. 3-287648

[51] Int. Cl.$^5$ ............................................. G03F 7/022
[52] U.S. Cl. ..................................... 430/191; 430/192; 430/193; 430/270; 430/326; 430/909; 522/27
[58] Field of Search ............. 430/191, 190, 192, 193, 430/270, 326, 909, 919; 522/27

[56] References Cited

U.S. PATENT DOCUMENTS 5,130,225  7/1992  Uetani ................... 430/191

FOREIGN PATENT DOCUMENTS 0358871  3/1990  European Pat. Off. .
0435437  7/1991  European Pat. Off. .
3191351  8/1991  Japan .
3-200254  9/1991  Japan ................... 430/192
4-12357   1/1992  Japan ................... 430/192
4-13146   1/1992  Japan ................... 430/191
9012776  11/1990  PCT Int'l Appl. .

OTHER PUBLICATIONS

Abstract of Japanese Patent 3-191351.
European Search Report Dec. 22, 1992.

*Primary Examiner*—Marion E. McCamish
*Assistant Examiner*—Janis L. Dote
*Attorney, Agent, or Firm*—Birch, Stewart, Kolasch & Birch

[57] ABSTRACT

A positive radiation-sensitive resist composition comprising an alkali-soluble resin, a radiation-sensitive ingredient and a phenol compound represented by the general formula (I):

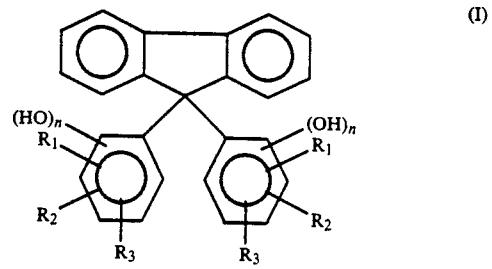

(I)

wherein $R_1$, $R_2$ and $R_3$ independently of one another each represent a hydrogen atom, an alkyl group or an alkoxy group and n represents 1, 2 or 3.

8 Claims, No Drawings

POSITIVE RADIATION-SENSITIVE RESIST COMPOSITION

BACKGROUND OF THE INVENTION

1. Field of the Invention

This invention relates to a positive type radiation-sensitive resist composition which is sensitive to radiation such as ultraviolet rays, far ultraviolet rays including excimer laser and the like, ion beam, X ray, and the like.

2. Description of the Related Art

Hitherto, integrated circuits have been produced according to the mask contact printing method. However, the mask contact printing method is disadvantageous in that a finely fabricated mask is difficult to prepare and resolution of the process cannot exceed 2 μm. For this reason, the reduced projection process exhibiting a resolution of sub-micron order is mainly used today in its place. However, the reduced projection process is disadvantageous in that the total exposure time per sheet of wafer is long, and improvement of resist sensitivity is necessary in order to solve this problem. If the exposure time can be shortened by improving the sensitivity of the resist, the through-put can be improved and thereby the yield of integrated circuits can be increased.

On the other hand, due to the increase in the degree of integration in integrated circuits (particularly LSI), the width of wiring has been lessened more and more, as a result of which the method of dry etching has been adopted in addition to the prior wet etching method. In the dry etching method, the resist is required to have a higher level of heat resistance (dry etching resistance) than in the prior methods.

In order to enhance the sensitivity of the resist, a method of lessening the molecular weight of the alkali-soluble resin is generally adopted. However, this method is disadvantageous in that the so-called γ value which is dependent on the difference in dissolution velocities of the unexposed areas into a developing solution are lowered, the resolution is lowered, the heat resistance of the resist is lowered, and the adhesion between resist the and the substrate is lowered. As improvement in one of these performances brings about a deterioration in another performance, it has been very difficult to prepare the positive type resist composition having the excellent performances, such as resolution, sensitivity and heat resistance.

SUMMARY OF THE INVENTION

An object of the present invention is to provide a positive type, radiation-sensitive resist composition which exhibits excellent balance between the performances, such as resolution, sensitivity and heat resistance.

According to the present invention, there is provided a positive type radiation-sensitive resist composition comprising an alkali-soluble resin, a radiation-sensitive ingredient and a phenol compound represented by the general formula (I):

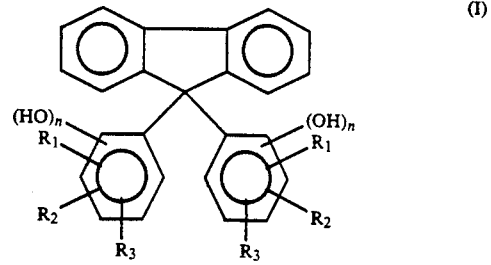

wherein $R_1$, $R_2$ and $R_3$ independently of one another each represent a hydrogen atom, an alkyl group or an alkoxy group and n represents 1, 2 or 3.

DETAILED DESCRIPTION OF THE INVENTION

In the above general formula (I), the alkyl group for $R_1$ to $R_3$ may be a straight or branched one having from 1-5 carbon atoms. Similarly, the alkoxy group for $R_1$ to $R_3$ may be a straight or branched one having from 1-3 carbon atoms. Preferably, $R_1$ to $R_3$ each represents a hydrogen atom, an alkyl group having 1-5 carbon atoms or an alkoxy group having 1-2 carbon atoms. A hydrogen atom, a methyl group or a methoxy group for $R_1$ to $R_3$ are particularly preferred.

A preferred example of the phenol compound include the following:

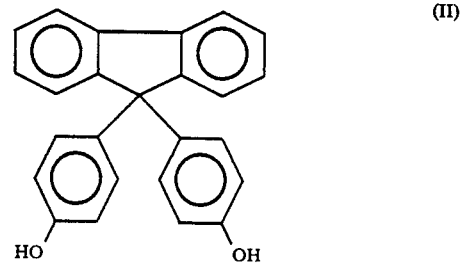

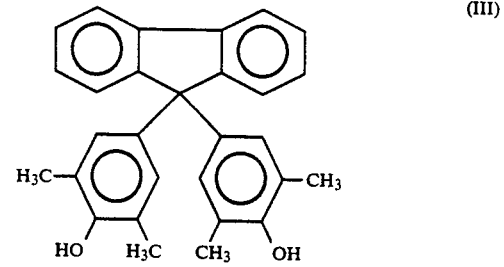

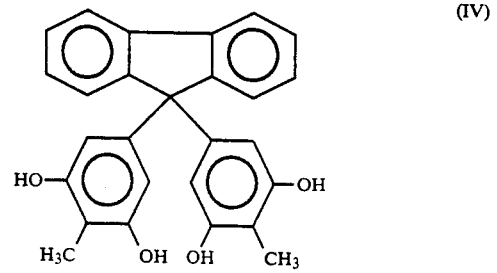

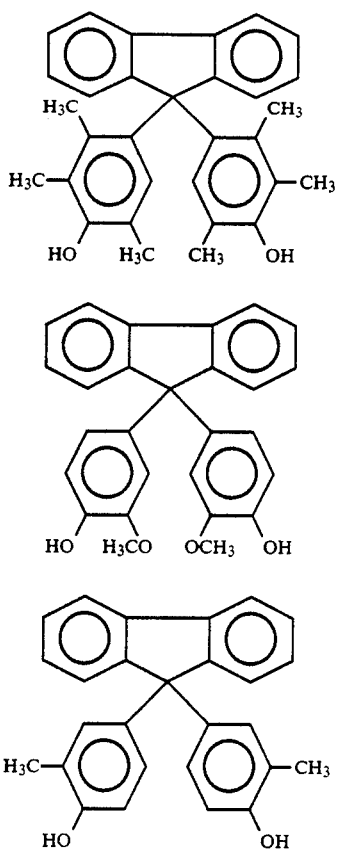

and the like.

The phenol compound (I) can be produced by reacting 9-fluorenone and a phenol in the presence of an acid catalyst, such as sulfuric acid and the like, and a solvent, such as alcohol and the like.

Examples of the phenol include phenol, resorcin, catechol, pyrogallol, cresol, xylenol, 2,3,5-trimethylphenol, methoxyphenol, ethylphenol, 2-methylresorcin and the like.

The phenol compound (I) is used preferably in an amount of from 4 to 40 parts by weight per 100 parts by weight of the sum of the alkali-soluble resin mentioned later and the phenol compound itself, from the viewpoint of facilitating the development and the patterning.

As examples of the alkali-soluble resin, polyvinylphenol, novolac resin and the like can be referred to.

Examples of the novolac resin include the resins prepared by conducting a condensation reaction between one member selected from phenols such as phenol, o-cresol, m-cresol, p-cresol, 2,5-xylenol, 3,5-xylenol, 3,4-xylenol, 2,3,5-trimethylphenol, 4-t-butylphenol, 2-t-butylphenol, 3-t-butylphenol, 3-ethylphenol, 2-ethylphenol, 4-ethylphenol, 2-t-butyl-5-methylphenol, 2-t-butyl-6-methylphenol, 2-t-butyl-4-methylphenol, 2-naphthol, 1,3-dihydroxynaphthalene, 1,7-dihydroxynaphthalene, 1,5-dihydroxynaphthalene and the like or a combination of two or more members thereof and an aldehyde such as formalin, paraformaldehyde and the like in the usual manner. A preferred example of the novolac resin includes the resin prepared by conducting a condensation reaction between a mixture of m-cresol and p-cresol and an aldehyde. The condensation reaction is usually carried out in bulk or in an appropriate solvent at 60°–120° C. for 2–30 hours. When a catalyst is used, the catalyst is preferably selected from organic acids such as oxalic acid, p-toluenesulfonic acid, trichloroacetic acid, formic acid and the like, inorganic acids such as hydrochloric acid, sulfuric acid, perchloric acid, phosphoric acid and the like and divalent metal salts such as zinc acetate, magnesium acetate and the like.

As the novolac resins, those in that an area in a GPC pattern (using a UV detector of 254 nm) of a range in which a molecular weight as converted to polystyrene is not larger than 900 does not exceed 25% of the whole pattern area, isolated by means of crystallization, fractionation or the like, are preferably used.

As the radiation-sensitive ingredient, 1,2-quinonediazide compounds and the like can be utilized. Examples of the 1,2-quinonediazide compounds include 1,2-benzoquinonediazide-4-sulfonic acid esters, 1,2-naphthoquinonediazide-4-sulfonic acid esters, 1,2-naphthoquinonediazide-5-sulfonic acid esters and the like. The 1,2-quinonediazide compounds can be produced according to the known method, namely by a condensation reaction between a naphthoquinonediazidesulfonyl halide or a benzoquinonediazidesulfonyl halide and a hydroxyl group-containing compound in the presence of a weak alkali. As the hydroxyl group-containing compound, hydroquinone; resorcin; phloroglucin; oxyflavans represented by the following formula:

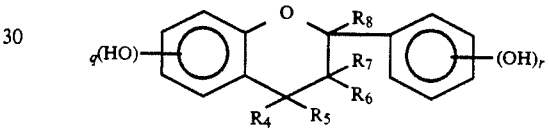

wherein q represents 0, 1, 2, 3 or 4 and r represents 1, 2, 3, 4 or 5, provided that q+r is a number of 2 or greater, $R_4$ to $R_8$ taken independently of one another each represents a hydrogen atom, an alkyl group, an alkenyl group, a cycloalkyl group, an aralkyl group or an aryl group, or $R_4$ and $R_5$ taken jointly and $R_7$ and $R_8$ taken jointly, independently of one another, each represent a ring, provided that either of $R_4$ and $R_5$ represents an alkyl group, an alkenyl group, a cycloalkyl group, an aralkyl group or an aryl group; alkyl gallates; hydroxybenzophenones represented by the following formula:

wherein s+t is an integer of 2 to 6; and the like are utilized.

The radiation-sensitive ingredient is used either singly or in the form of a mixture of two or more members.

The ratio of the radiation-sensitive ingredient to the alkali-soluble resin is usually 5–100 parts by (preferably 10–50 parts by weight) of radiation-sensitive ingredient to 100 parts by weight of alkali-soluble resin, because at such a ratio patterning is easy to carry out and sensitivity is good.

A positive type resist solution is prepared by mixing and dissolving the positive type radiation-sensitive resist composition of this invention into a solvent.

A solvent used in the preparation of the positive type resist solution is preferably one that evaporates at a suitable drying rate to give a uniform and smooth coating film. The solvents preferably used for this purpose include ethyl cellosolve acetate, methyl cellosolve acetate, ethyl cellosolve, methyl cellosolve, propylene glycol monomethyl ether acetate, propylene glycol monoethyl ether acetate, ethyl pyruvate, butyl acetate, methyl isobutyl ketone, 2-heptanone, xylene, ethyl lactate, γ-butyrolactone and the like. These solvents may be used independently or as a mixture thereof. An amount of the solvent is not limited insofar as the composition can form a uniform film on a wafer without pinholes or coating irregularity. In the case of ethyl cellosolve acetate, for example, it is used in an amount of 30-80 parts by weight per 100 parts by weight of the positive type radiation-sensitive resist composition.

If desired, a small quantity of resin, dye and the like may be added to the positive type resist solution.

PREFERRED EMBODIMENTS OF THE INVENTION

The present invention will be explained more concretely by following examples which are not intended to limit the scope of the present invention.

Referential Example 1

At 70°-75° C., 600 g of phenol, 287 g of 9-fluorenone, 300 g of methanol as solvent and 388 g of 98% sulfuric acid were subjected to reaction with stirring for 50 hours. After cooling the reaction mixture to room temperature, 3000 g of ethyl acetate and 1000 g of toluene were added thereto as solvent. After separating the organic layer, it was washed with water. After distilling off the solvent and the excessive phenol from the organic layer, the residue was crystallized by adding a toluene/n-hexane (38:41) mixture thereto. Thus, a compound represented by the following formula (II):

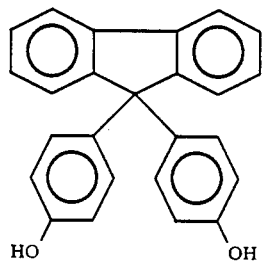

(II)

was obtained.

Referential Example 2

A mixture of 162 g of m-cresol, 162 g of p-cresol, 302 g of ethyl cellosolve acetate and 36.5 g of 5% aqueous oxalic acid cellosolve was heated at 80° C. with stirring. Then, at that temperature, 182 g of 37% aqueous formaldehyde solution was dropwise added over a period of one hour. After dropping it, the resulting mixture was reacted for an additional 7 hours. After cooling it to room temperature, it was neutralized, washed with water and dehydrated to obtain 650 g of a solution of a novolac resin in ethyl cellosolve acetate having a novolac resin content of 34.1%. As measured by GPC, the weight average molecular weight of the novolac resin expressed in terms of polystyrene was 4,600.

Referential Example 3

A mixture of 120 g of the solution of novolac resin in ethyl cellosolve acetate, having a novolac resin content of 34.1%, obtained in Referential Example 2, 425.8 g of ethyl cellosolve acetate and 292.7 g of n-heptane was stirred at 20° c for 30 minutes. After separating the organic layer, n-heptane was distilled off therefrom to obtain 40 g of a solution of novolac resin in ethyl cellosolve acetate having a novolac resin content of 36.3%. As measured by GPC, the weight average molecular weight expressed in terms of polystyrene was 8,300.

Examples 1 and 2

The compound obtained in Referential Example 1 and one of the novolac resin solutions obtained in Referential Examples 2 and 3 were admixed with ethyl cellosolve acetate together with a radiation-sensitive ingredient at the composition ratio shown in Table 1 to prepare respective resist solutions. The quantity of ethyl cellosolve acetate was controlled so as to give a film thickness of 1.055 μm under the coating conditions shown below. The compositions thus obtained were filtered through a 0.2 μm Teflon filter to prepare resist solutions. A silicon wafer having been washed in the usual manner was coated with each resist solution up to a thickness of 1.055 μm by means of a spin coating machine. Then, the coated silicon wafer was baked by means of a hot plate at 90° C. for 60 seconds. Then, the wafer was exposed to light by means of a reduction projection exposing apparatus (manufactured by Nikon; NSR 1755i7A; NA=0.50) having an exposure wavelength of 365 nm (i line), while stepwise changing the quantity of exposure. After exposure, it was baked by means of a hot plate at 110° C. for 60 seconds, and then developed for one minute with developing solution SOPD manufactured by Sumitomo Chemical Co., Ltd. to obtain a positive type pattern.

Sensitivity of the resist was determined by plotting the quantity of exposure against the residual film thickness of resist.

Heat resistance of resist was determined by heating a wafer on which a resist pattern had been formed by means of a direct hot plate for 3 minutes at a predetermined temperature and thereafter examining the occurrence of thermal deformation in the 3 μm line-and-space pattern by means of SEM.

Comparative Examples 1 and 2

One of the novolac resin solutions obtained in Referential Examples 2 and 3 were admixed with ethyl cellosolve acetate together with a radiation-sensitive ingredient at the composition ratio shown in Table 1 to prepare resist solutions. Using each resist solution, exposure to light, development and evaluation of heat resistance were carried out.

The results are summarized in Table 1. It is apparent therefrom that the resist compositions of this invention are much improved as compared with those of the comparative examples in the balance between sensitivity, resolution and heat resistance.

TABLE 1

|  | Example | | Comparative Example | |
|---|---|---|---|---|
|  | 1 | 2 | 1 | 2 |
| Amount of the phenol compound obtained in Referential Example 1 (parts by wt.) | 3 | 3 | — | — |
| Kind of novolac resin [Referential Example No.] | 2 | 3 | 2 | 3 |

TABLE 1-continued

|  | Example 1 | Example 2 | Comparative Example 1 | Comparative Example 2 |
|---|---|---|---|---|
| [Amount (parts by wt.)] | 11 | 11 | 11 | 11 |
| Amount of radiation-sensitive ingredient *1 (parts by wt.) | 3 | 3 | 3 | 3 |
| Sensitivity *2 (msec) | 120 | 180 | 650 | 2500 |
| Heat resistance *3 (°C.) | 130 | 160 | 135 | 165 |
| Resolution (μm) | 0.425 | 0.4 | 0.45 | —*4 |

*1 A condensation product between naphthoquinone (1,2)-diazide-(2)-5-sulfonyl chloride and the following compound (molar ratio of the reaction = 1:2.8)

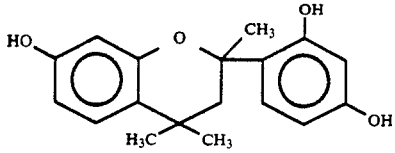

*2 Minimum quantity of exposure giving a resist film thickness of zero.
*3 The temperature at which a 3 μm line-and-space pattern begins a thermal deformation.
*4 No rectangular profile was obtained because the sensitivity was too slow.

The present invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A positive radiation-sensitive resist composition comprising an alkali-soluble resin, a radiation-sensitive ingredient and a phenol compound represented by the general formula (I):

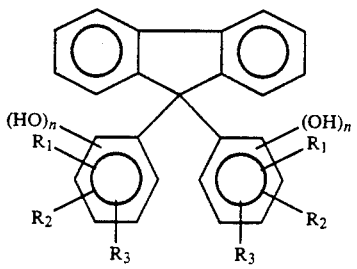

(I)

wherein $R_1$, $R_2$ and $R_3$ independently of one another each represent a hydrogen atom, an alkyl group or an alkoxy group and n represents 1, 2 or 3.

2. A positive radiation-sensitive resist composition according to claim 1, wherein said phenol compound represented by general formula (I) is selected from at least one compound represented by one of the following formulas (III), (IV), (V), (VI) or (VII):

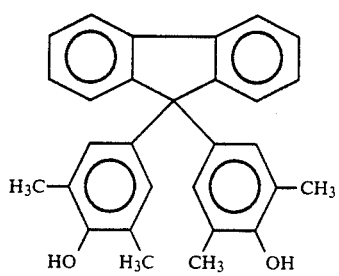

(III)

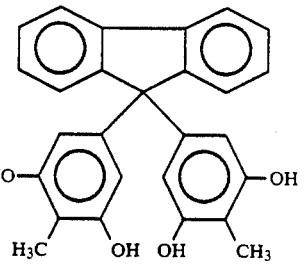

(IV)

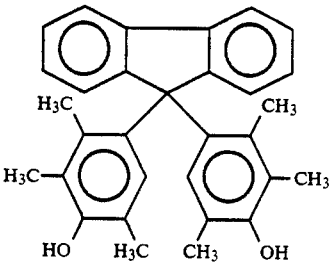

(V)

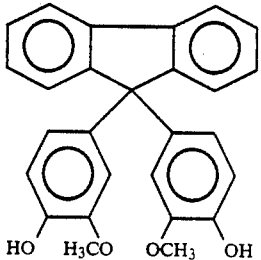

(VI)

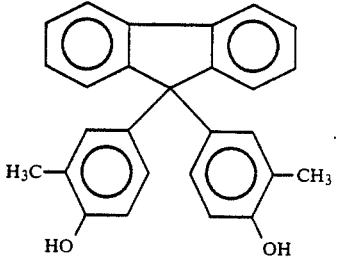

(VII)

3. A positive radiation-sensitive resist composition according to claim 1, wherein said phenol compound represented by general formula (I) is a compound represented by the following formula (II):

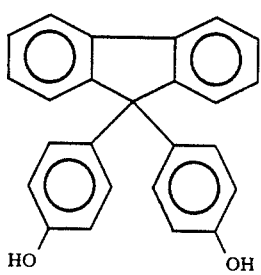

(II)

4. A positive radiation-sensitive resist composition according to claim 1, wherein said alkali-soluble resin is a polyvinylphenol or a novolac resin.

5. A positive radiation-sensitive resist composition according to claim 1, wherein said alkali-soluble resin is a novolac resin prepared by a condensation reaction between at least one member selected from the group consisting of phenol, o-cresol, m-cresol, p-cresol, 2,5-xylenol, 3,5-xylenol, 3,4-xylenol, 2,3,5-trimethylphenol, 4-t-butylphenol, 2-t-butylphenol, 3-t-butylphenol, 3-ethylphenol, 2-ethylphenol, 4-ethylphenol, 2-t-butyl-5-methylphenol, 2-t-butyl-6-methylphenol, 2-t-butyl-4-methylphenol 2-naphthol, 1,3-dihydroxynaphthalene, 1,7-dihydroxynaphthalene and 1,5-dihydroxynaphthalene, and formalin or paraformaldehyde.

6. A positive radiation-sensitive resist composition according to claim 1, wherein said radiation-sensitive ingredient is selected from at least one of a 1,2-benzoquinonediazide-4- sulfonic acid ester, 1,2-naphthoquinonediazide-4-sulfonic acid ester or 1,2-naphthoquinonedeazide-5-sulfonic acid ester.

7. A positive radiation-sensitive resist composition according to claim 1, wherein said radiation-sensitive ingredient is used in an amount of from 5-100 parts by weight per 100 parts by weight of said alkali-soluble resin.

8. A positive radiation-sensitive resist composition according to claim 1, wherein said phenol compound is used in an amount of from 4-40 parts by weight per 100 parts by weight of the sum of said alkali-soluble resin and said phenol compound.

* * * * *